United States Patent
Matsuu et al.

(10) Patent No.: US 9,945,658 B2
(45) Date of Patent: Apr. 17, 2018

(54) WAVELENGTH TUNABLE SURFACE EMITTING LASER AND OPTICAL COHERENCE TOMOGRAPHY APPARATUS INCLUDING THE SAME

(71) Applicant: CANON KABUSHIKI KAISHA, Tokyo (JP)

(72) Inventors: Toshimitsu Matsuu, Yokohama (JP); Takeshi Uchida, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 255 days.

(21) Appl. No.: 14/552,019

(22) Filed: Nov. 24, 2014

(65) Prior Publication Data
US 2015/0146212 A1 May 28, 2015

(30) Foreign Application Priority Data

Nov. 27, 2013 (JP) .................................. 2013-244997

(51) Int. Cl.
*H01S 5/183* (2006.01)
*G01B 9/02* (2006.01)
*H01S 5/10* (2006.01)

(52) U.S. Cl.
CPC ..... *G01B 9/02091* (2013.01); *G01B 9/02004* (2013.01); *H01S 5/105* (2013.01); *H01S 5/18366* (2013.01); *H01S 5/18369* (2013.01)

(58) Field of Classification Search
CPC .. H01S 5/18361; H01S 5/18369; H01S 5/187; H01S 5/18366; H01S 5/105; G01B 9/02004; G01B 9/0209
See application file for complete search history.

(56) References Cited

U.S. PATENT DOCUMENTS 6,194,119 B1 * 2/2001 Wolk ..................... B41M 3/006
156/234
2004/0076198 A1 * 4/2004 Spoonhower ....... H01S 5/18366
372/20
(Continued)

FOREIGN PATENT DOCUMENTS

JP    H04-199688 A    7/1992
JP    H06-314854 A    11/1994
(Continued)

OTHER PUBLICATIONS

Chang-Hasnain, Connie J.; "Tunable VCSEL;" IEEE Journal on Selected Topics in Quantum Electronics, vol. 6, No. 6, Nov./Dec. 2000, pp. 978-987.

*Primary Examiner* — Michael P Lapage
(74) *Attorney, Agent, or Firm* — Canon U.S.A., Inc. IP Division

(57) ABSTRACT

A surface emitting laser includes a lower reflector, an active layer, a gap portion, an upper reflector, and a driving unit. The lower reflector, the active layer, the gap portion, and the upper reflector are arranged in that order. The surface emitting laser is capable of varying a wavelength of emitted light by changing a distance between the upper and lower reflectors. The driving unit moves one of the upper and lower reflectors in an optical axis direction of the emitted light. At least one of the upper and lower reflectors includes a stacked body in which first layers and second layers are alternately stacked, the second layers having a refractive index lower than a refractive index of the first layers, outermost layers of the stacked body being the first layers, and a third layer provided on at least one end of the stacked body.

16 Claims, 9 Drawing Sheets

(56) References Cited

U.S. PATENT DOCUMENTS

| | | | |
|---|---|---|---|
| 2004/0190584 A1* | 9/2004 | Spoonhower | G02B 6/4202 372/108 |
| 2005/0195874 A1* | 9/2005 | Forrest | H01S 3/168 372/39 |
| 2006/0029118 A1* | 2/2006 | Chen | H01S 5/18394 372/96 |
| 2009/0278233 A1* | 11/2009 | Pinnington | H01L 21/02389 257/615 |
| 2014/0064315 A1* | 3/2014 | Dummer | H01S 5/0261 372/50.124 |
| 2014/0268169 A1* | 9/2014 | Jayaraman | H01S 5/18366 356/479 |
| 2015/0010031 A1* | 1/2015 | Makino | H01S 5/18311 372/45.01 |
| 2015/0171597 A1* | 6/2015 | Yvind | H01S 5/0222 372/20 |

FOREIGN PATENT DOCUMENTS

| | | |
|---|---|---|
| JP | H10-074979 A | 3/1998 |
| JP | H10-284806 A | 10/1998 |
| JP | 2002-353561 A | 12/2002 |
| JP | 2004-109556 A | 4/2004 |
| JP | 2004-281733 A | 10/2004 |
| JP | 2004-289163 A | 10/2004 |
| JP | 2007-278868 A | 10/2007 |
| JP | 2011-044447 A | 3/2011 |
| JP | 2011-134967 A | 7/2011 |
| JP | 2013-518430 A | 5/2013 |

\* cited by examiner

WAVELENGTH TUNABLE SURFACE EMITTING LASER AND OPTICAL COHERENCE TOMOGRAPHY APPARATUS INCLUDING THE SAME

BACKGROUND OF THE INVENTION

Field of the Invention

The present invention relates to a surface emitting laser and an optical coherence tomography apparatus including the surface emitting laser.

Description of the Related Art

Vertical cavity surface emitting lasers (VCSELs) are an example of surface emitting lasers. VCSELs include an active layer and two reflectors that sandwich the active layer from above and below to form a resonator in a direction perpendicular to the surface of a substrate. VCSELs emit a laser beam in the direction perpendicular to the surface of the substrate. Also, wavelength tunable VCSELs, with which the wavelength of emitted light can be varied, are known. In an example of such a VCSEL, a gap portion is provided between an upper reflector and an active layer of the VCSEL, and the wavelength of emitted light can be varied by varying the cavity length by moving the upper reflector in a direction of the optical path of the laser beam. Surface emitting lasers with which the wavelength of the emitted light can be varied are hereinafter referred to as wavelength tunable VCSELs.

It is known that wavelength tunable VCSELs are suitable for use as light sources of optical coherence tomography (OCT) apparatuses. In the case where a wavelength tunable VCSEL is used as a light source of an OCT apparatus, the tunable wavelength range of the wavelength tunable VCSEL may be increased to increase the axial resolution of the OCT apparatus. The tunable wavelength range of the wavelength tunable VCSEL may be increased by, for example, increasing the reflectances of reflectors arranged above and below the active layer over a wide reflection range.

A wavelength tunable VCSEL in which a pair of distributed Bragg reflectors (DBRs) are arranged above and below an active layer is disclosed in IEEE Journal on Selected Topics in Quantum Electronics, Vol. 6, No. 6, November 2000 (hereinafter referred to as Non-Patent Document 1).

To achieve a high reflectance for laser oscillation, DBRs having a multilayer structure including dielectric or semiconductor layers are generally used as reflectors. A general DBR is formed by alternately stacking two types of layers having different refractive indices such that the optical thickness of the layers is ¼ of the center wavelength of the wavelength range of the laser beam. Here, the optical thickness of a layer is the product of the thickness of the layer and the refractive index of the material of the layer. The reflectance and reflection range of a DBR are determined by the difference in refractive index between the two types of layers and the number of layers that are stacked. As the difference in refractive index between the two types of layers and the number of layers that are stacked increase, the reflection range and the reflectance increase (see FIGS. 9A and 9B). When the wavelength range in which the reflectance is high is increased, the reflectance itself is also increased (see FIGS. 9A and 9B). When the reflectance of the reflector at the light emission side of a laser is too high, light cannot be emitted. When the reflectance is too low, the threshold of laser oscillation increases. Therefore, the reflectance of the reflector at the light emission side is set to an appropriate value.

More specifically, when the number of layers included in a DBR is increased to obtain a high reflectance over a wide range, there is a risk that the reflectance will be too high and it will be difficult for light to be emitted out of the laser. In contrast, when the reflectance is low, the amount of light that leaves the resonator increases, and it becomes difficult to achieve laser oscillation. Thus, the light emission efficiency may be reduced when the reflectance is too high, and the threshold current for emitting a laser beam may be increased when the reflectance is too low.

In consideration of the above-described circumstances, the present invention provides a surface emitting laser including a reflector having reflectance characteristics with which light emission efficiency is not reduced and a threshold current is not increased over a wide wavelength range.

SUMMARY OF THE INVENTION

A surface emitting laser according to an embodiment of the present invention includes a lower reflector, an active layer, a gap portion, an upper reflector, and a driving unit. The lower reflector, the active layer, the gap portion, and the upper reflector are arranged in that order. The surface emitting laser is capable of varying a wavelength of emitted light by changing a distance between the upper and lower reflectors. The driving unit moves one of the upper and lower reflectors in an optical axis direction of the emitted light. At least one of the upper and lower reflectors includes a stacked body in which first layers and second layers are alternately stacked, the second layers having a refractive index lower than a refractive index of the first layers, outermost layers of the stacked body being the first layers, and a third layer provided on at least one end of the stacked body and configured such that an optical thickness nd of the third layer satisfies $0 < nd < \lambda_0/2$, where $\lambda_0$ is a center wavelength of the emitted light, the third layer having a refractive index that is lower than the refractive index of the first layers and higher than a refractive index of a layer provided adjacent to the third layer at a side opposite to a side at which the stacked body is provided.

Further features of the present invention will become apparent from the following description of exemplary embodiments with reference to the attached drawings.

DESCRIPTION OF THE EMBODIMENTS

Figure 1:
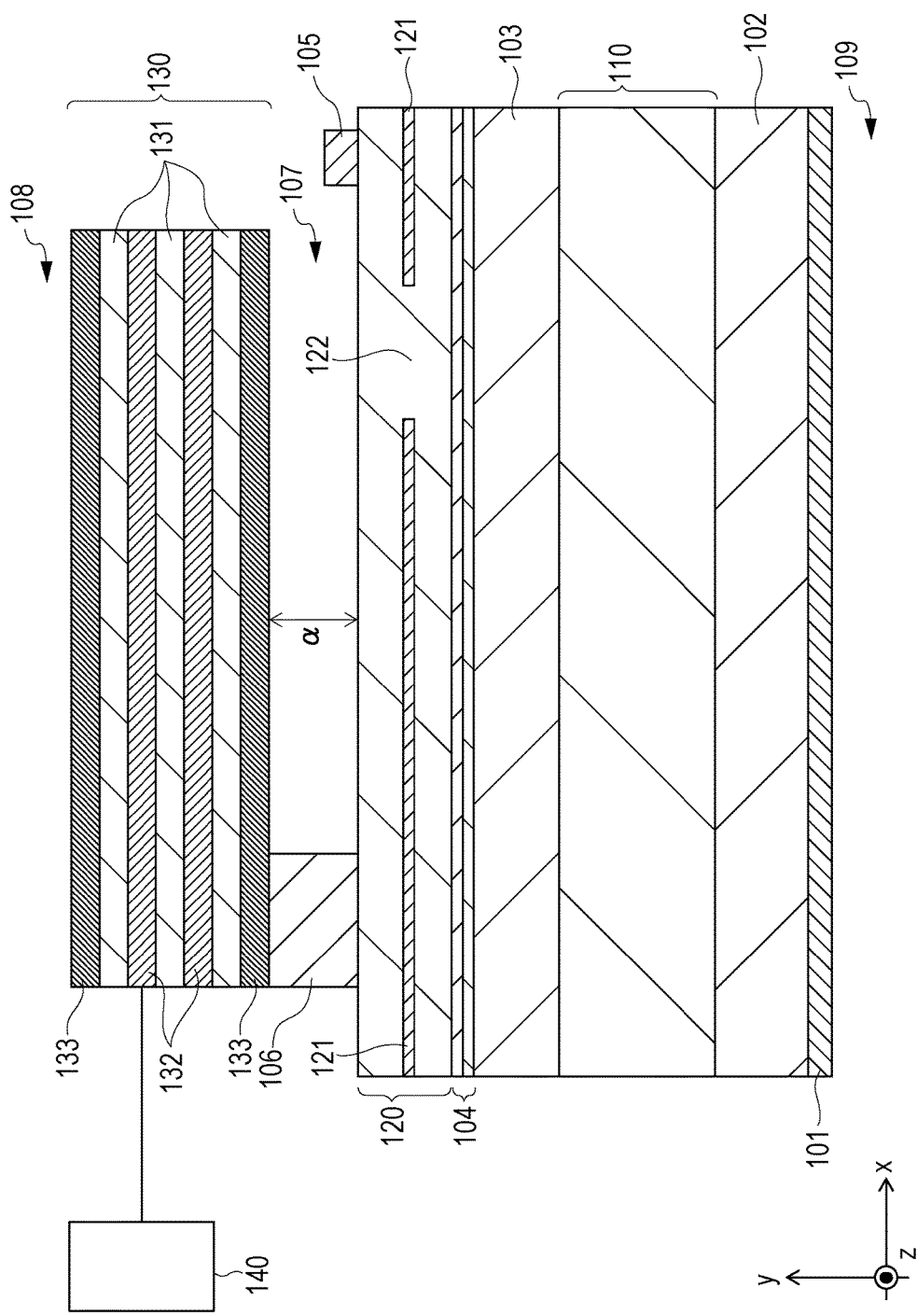
FIG. 1 is a sectional view illustrating the structure of a wavelength tunable VCSEL according to an embodiment of the present invention.

A wavelength tunable VCSEL according to an embodiment of the present invention will now be described. FIG. 1 is a sectional view of a surface emitting laser according to the present embodiment.

As illustrated in FIG. 1, the surface emitting laser according to the present embodiment includes a lower electrode 101, a substrate 102 formed on the lower electrode 101, a lower reflector 110 formed on the substrate 102, a lower cladding layer 103 formed on the lower reflector 110, an active layer 104 formed on the lower cladding layer 103, an upper cladding layer 120 formed on the active layer 104, and an upper electrode 105 formed on the upper cladding layer 120. A support layer 106 (semi-insulating layer) is formed on the upper cladding layer 120, and an upper reflector 130 is formed on the support layer 106. The upper cladding layer 120 and the upper reflector 130 are separated from each other, and a gap portion 107 is provided therebetween. When a current is applied to the active layer 104 by the lower electrode 101 and the upper electrode 105, light is emitted. The emitted light reciprocates in a resonator formed of the lower reflector 110 and the upper reflector 130, so that stimulated emission occurs. As a result of the stimulated emission in the resonator, the light is emitted through the upper reflector 130 in a direction perpendicular to the surface of the substrate 102, that is, in a y direction, as a laser beam having a certain wavelength. The upper cladding layer 120 includes a current blocking layer 121. Therefore, the current supplied from the electrode 105 passes through an opening 122 formed in the current blocking layer 121 and flows into the active layer 104.

When the distance from the interface between the upper cladding layer 120 and the gap portion 107 to the interface between the upper reflector 130 and the gap portion 107 (distance α in FIG. 1) is varied, the cavity length varies, and the wavelength of the oscillated laser beam varies accordingly. Therefore, the wavelength of the emitted laser beam can be varied by using a driving unit 140 that varies the distance α. In other words, the wavelength of the laser beam can be varied by moving the upper reflector 130 in an optical axis direction (y direction in FIG. 1) with the driving unit 140.

In the surface emitting laser according to the present embodiment, the lower reflector 110 and the upper reflector 130 are both DBRs. The lower reflector 110 has a multilayer structure in which high-refractive-index layers and low-refractive-index layers are alternately stacked.

Figure 2:
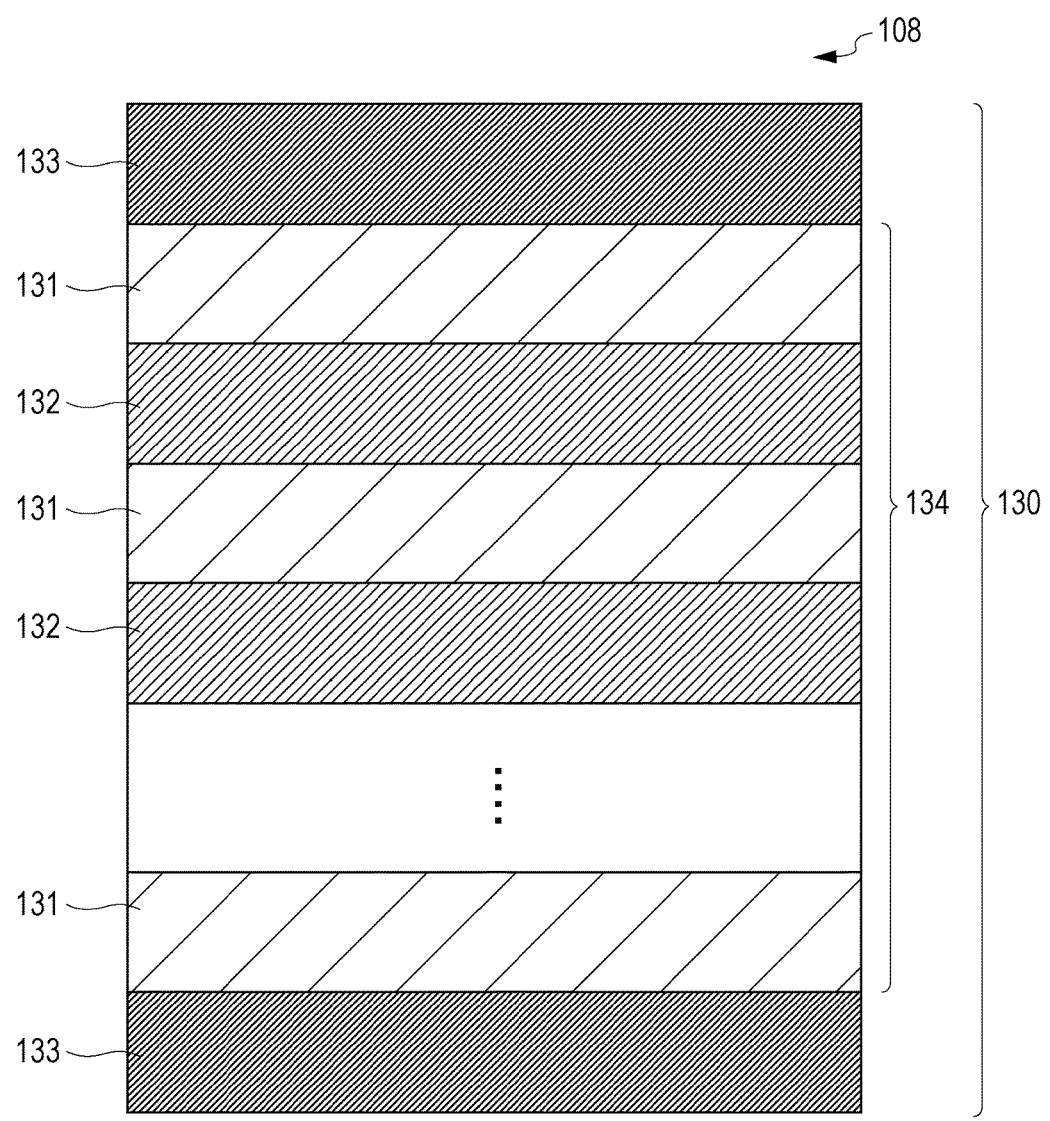
FIG. 2 is a sectional view illustrating the structure of an upper reflector according to the embodiment of the present invention.

The upper reflector 130 will now be described with reference to FIG. 2, which is an enlarged view of the upper reflector 130. The upper reflector 130 includes a stacked body 134 in which first layers 131 and second layers 132 are alternately stacked. The refractive index of the second layers 132 ($n_2$) is smaller than the refractive index of the first layers 131 ($n_1$) ($n_1 > n_2$). The outermost layers of the stacked body 134 in the stacking direction are the first layers 131. The number of layers included in the upper reflector 130 illustrated in FIGS. 1 and 2 is an example, and more layers are included in practice. The optical thickness of the first layers 131 and the second layers 132 is ¼ of the center wavelength $\lambda_0$ of the surface emitting laser according to the present embodiment.

In this specification, the center wavelength means the wavelength at the center of the wavelength range of light emitted from the surface emitting laser. In other words, the center wavelength means the middle value between the minimum wavelength and the maximum wavelength of the light emitted from the surface emitting laser. The wavelength of the light emitted from the laser is determined by factors including the variation range of the cavity length, the reflection range of the reflectors, and the gain range of the active layer. In the designing process, the center wavelength is basically set first, and then the configuration of each element is determined accordingly.

The upper reflector 130 having reflection characteristics such that the reflectance is high over a wide wavelength range can be obtained by increasing the numbers of the first layers 131 and the second layers 132 included in the upper reflector 130. However, as described above, when the reflection characteristics are such that the reflectance is high over a wide wavelength range, the reflectance may be too high and it may be difficult for the light to pass through the upper reflector 130, which is the reflector at the light emission side. In such a case, the light emission efficiency is reduced when the laser beam is emitted.

Accordingly, the surface emitting laser according to the present embodiment includes a layer that suppresses reflection in a region around the center wavelength, where the reflectance is particularly high in the reflection spectrum of the stacked body 134.

Figure 3A:
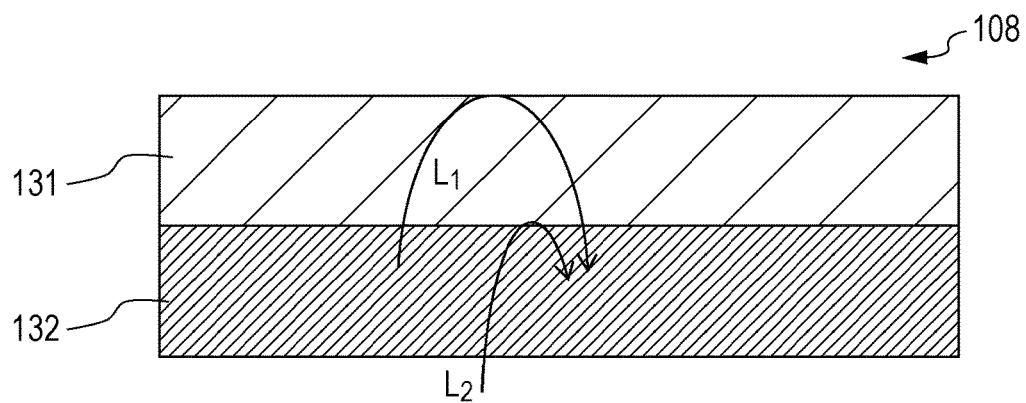
FIGS. 3A and 3B are diagrams for describing a reflectance-reducing effect of the wavelength tunable VCSEL according to the embodiment of the present invention.

More specifically, third layers 133, which has an optical thickness nd that satisfies $0<nd<\lambda_0/2$, are arranged on both ends of the stacked body 134 to suppress reflection in the region around the center wavelength. Each third layer 133 has a refractive index ($n_3$) that is lower than that of the first layers 131 and higher than that of one of the layers adjacent thereto (131 or 108) at a side opposite to a side at which the stacked body 134 is disposed, that is, higher than the refractive index of an air layer 108. The refractive indices $n_1$, $n_2$, and $n_3$ are all higher than the refractive index of the air layer 108 ($\approx 1$). When the center wavelength of the surface emitting laser is $\lambda_0$, the optical thickness nd of the third layers satisfies $\lambda_0/8 < nd < 3\lambda_0/8$. Furthermore, the optical thickness nd may be $\lambda_0/4$. This is because a high reflection suppressing effect is obtained around the center wavelength when the optical thickness of the third layers 133 is $\lambda_0/4$, and the range in which a high reflection suppressing effect is obtained shifts toward the long-wavelength side as the optical thickness of the third layers 133 increases from $\lambda_0/4$, and shifts toward the short-wavelength side as the optical thickness of the third layers 133 decreases from $\lambda_0/4$. In the present embodiment, the optical thickness of the third layers 133 is ¼ of the center wavelength $\lambda_0$ of the surface emitting laser according to the present embodiment. The effects of the third layers 133 will now be described with reference to FIGS. 3A and 3B. Referring to FIG. 3A, when no third layer 133 is provided, light $L_1$ reflected by the interface between a first layer 131 and an air layer 108 and light $L_2$ reflected by the interface between a second layer 132 and the first layer 131 have the same phase, and therefore enhance each other, so that the reflected light remains. This is because the optical path of the light $L_1$ is longer than that of the light $L_2$ by $\lambda_0/2$, and the phase of the light $L_2$ is shifted by $\lambda_0/2$ when the light $L_2$ that has passed through the layer having a low refractive index ($n_2$) is reflected by the interface between the layer having the low refractive index ($n_2$) and the layer having a high refractive index ($n_1$). As a result, the light $L_1$ and the light $L_2$ have the same phase.

Figure 3B:
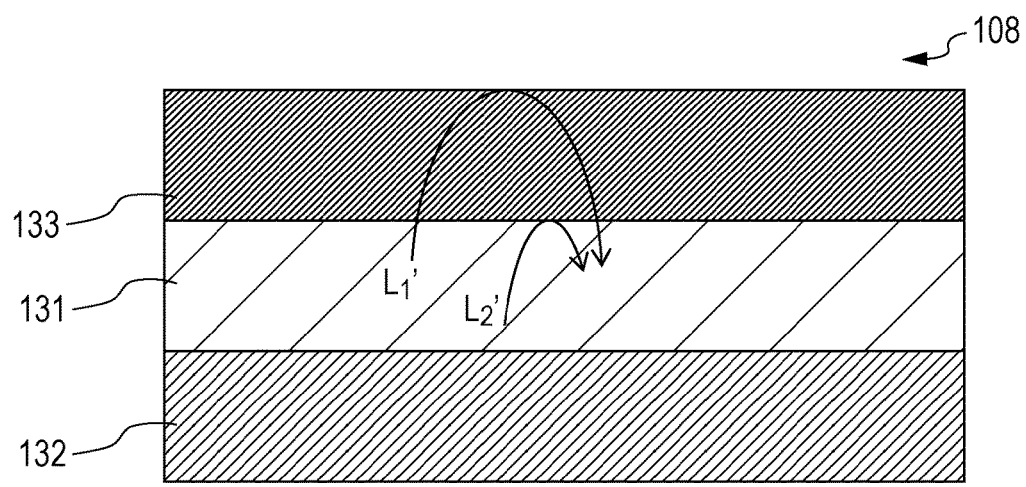

When a third layer 133 is provided as illustrated in FIG. 3B, light $L_1'$ reflected by the interface between the third layer 133 and the air layer 108 and light $L_2'$ reflected by the interface between the first layer 131 and the third layer 133 have phases shifted from each other by $\lambda_0/2$, and therefore weaken each other, so that no reflection occurs. This is because the optical path of the light $L_1'$ is longer than that of the light $L_2'$ by $\lambda_0/2$, and the phase of the light $L_2'$ is not shifted when the light $L_2'$ that has passed through the layer having the high refractive index ($n_1$) is reflected by the interface between the layer having the high refractive index ($n_1$) and the layer having the low refractive index ($n_3$). As a result, the light $L_1'$ and the light $L_2'$ have different phases.

The reflection suppressing effect increases as the wavelength approaches the center wavelength $\lambda_0$. Therefore, the reflectance is low when the wavelength is around the center wavelength $\lambda_0$, where the reflectance is otherwise particularly high, and the reflection suppressing effect decreases in wavelength ranges where the reflectance is lower than that at the center wavelength $\lambda_0$.

As a result, the reflectance is prevented from being excessively high over a wide reflection range, or low, so that an increase in threshold current and a reduction in light emission efficiency can be suppressed.

Figure 4:
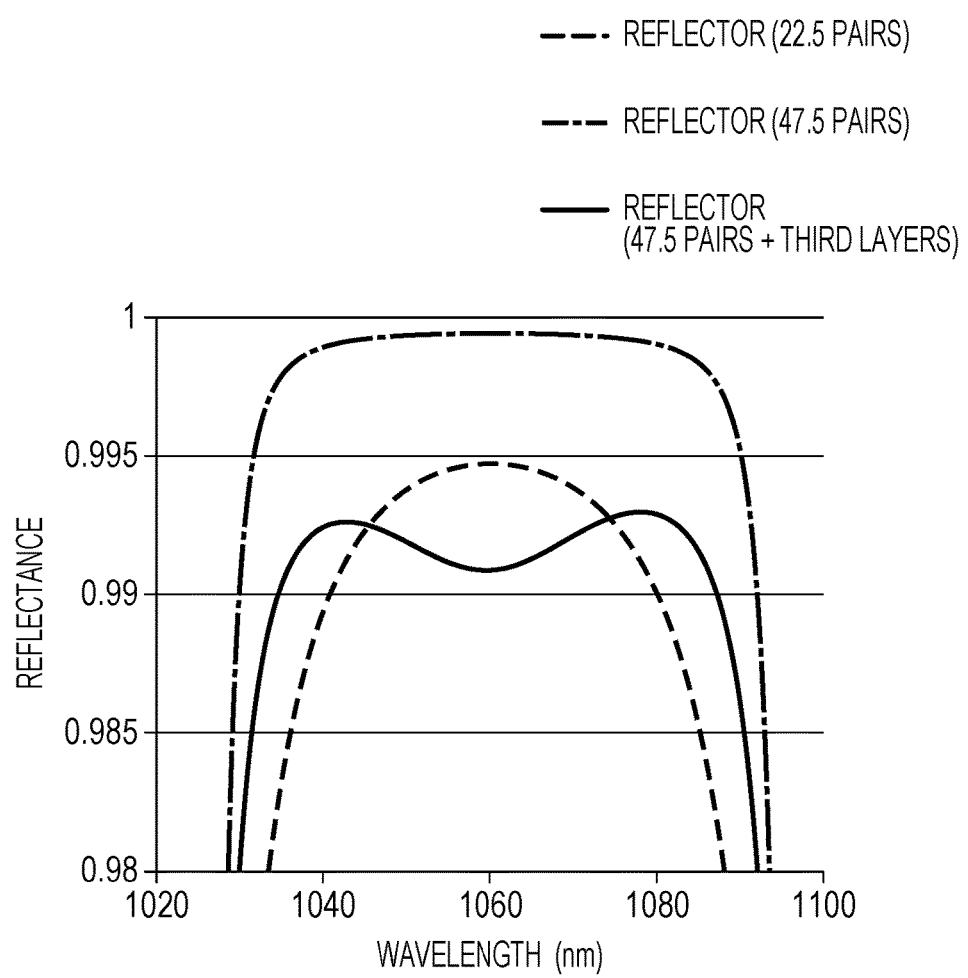
FIG. 4 shows a calculation result of wavelength dependency of the reflectance of the upper reflector according to the embodiment of the present invention.

FIG. 4 shows a calculation result showing that the reflectance can be suppressed by arranging the third layers 133. In the calculation, it is assumed that the first layers, which are high-refractive-index layers, are formed of $Al_{0.2}Ga_{0.8}As$, the second layers, which are low-refractive-index layers, are formed of $Al_{0.2}Ga_{0.2}As$, and the third layers are formed of $Al_{0.55}Ga_{0.45}As$. The refractive indices of the first to third layers are $n_1=3.35$, $n_2=3.05$, and $n_3=3.14$. In FIG. 4, the dashed line shows the wavelength dependency of the reflectance of a reflector in which 22 pairs of layers, each pair including a first layer and a second layer, and an additional first layer (22.5 pairs) are stacked together such that the first and second layers are alternately arranged and the outermost layers of the stacked body are the first layers. Also, the dotted chain line shows the wavelength dependency of the reflectance of a reflector in which 47 pairs of layers, each pair including a first layer and a second layer, and an additional first layer (47.5 pairs) are stacked together such that the first and second layers are alternately arranged and the outermost layers of the stacked body are the first layers. The solid line shows the wavelength dependency of the reflectance of a reflector in which the third layers are provided on both ends of the above-mentioned reflector including the 47.5 pairs of layers (47.5 pairs+third layers). The optical thickness of each of the first to third layers is set to ¼ of the center wavelength (1060 nm). Referring to FIG. 4, the peak reflectance of the reflector including the 22.5 pairs of layers is about 99.5%, and that of the reflector including the 47.5 pairs of layers is about 99.9%. Although the peak reflectance of the reflector including the 22.5 pairs of layers is suitable for light emission, the reflection range is narrow. In contrast, when the reflector including the 47.5 pairs of layers is used, although the reflection range is wide, since the peak reflectance is about 99.9%, the light emission efficiency is not very high. With the reflector according to the present embodiment (47.5 pairs+third layers), the reflection range is wide and the reflectance is within an optimum range. When the reflector having such a structure is used as the reflector at the light emission side, the laser beam can be efficiently oscillated over a wide wavelength range in the surface emitting laser.

In the above-described example, the upper reflector 130 has the multilayer structure in which the third layers 133 are provided on both ends of the stacked body 134. However, the lower reflector 110 may instead have the multilayer structure including the third layers. Alternatively, the upper and lower reflectors may both have the multilayer structure including the third layers. In each of the upper reflector 130 and the lower reflector 110, a third layer 133 may be provided at only one end thereof.

Figure 5A:
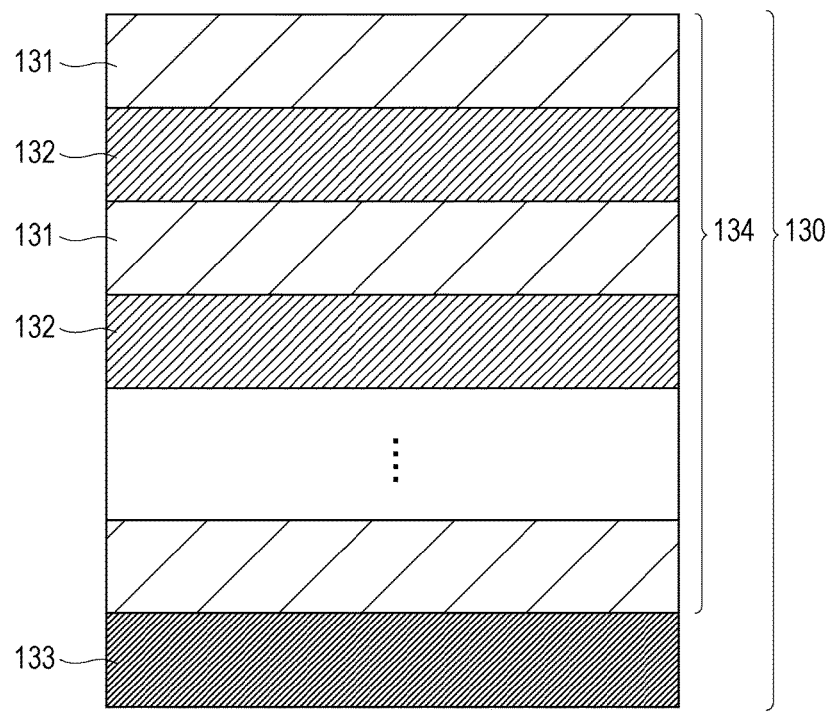
FIG. 5A is a diagram illustrating an upper reflector having another structure according to the embodiment of the present invention.
Figure 5B:
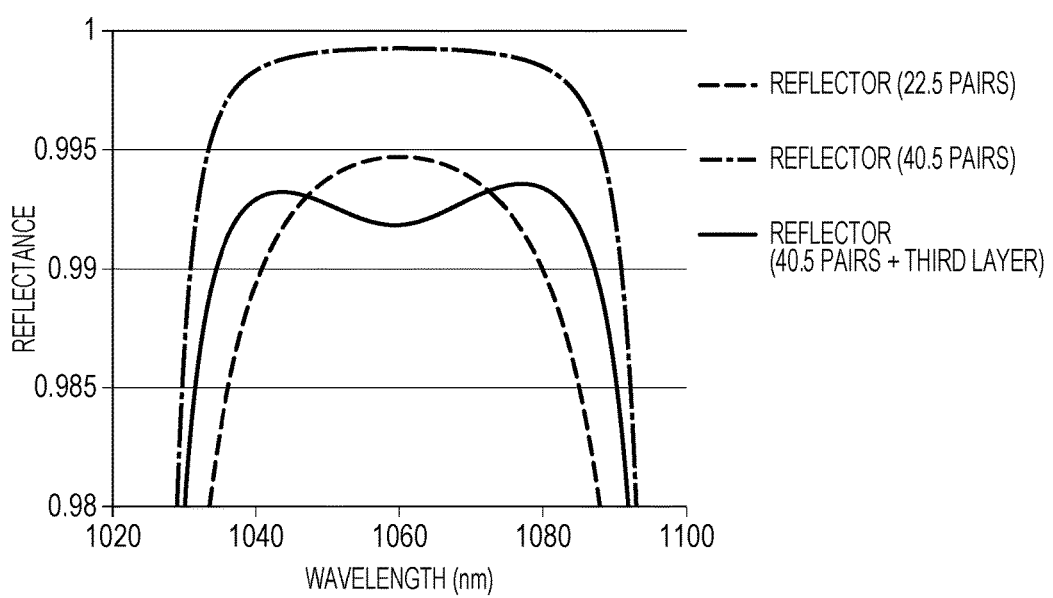
FIG. 5B shows a calculation result of wavelength dependency of the reflectance of the upper reflector having the other structure according to the embodiment of the present invention.

FIG. 5A illustrates an example of an upper reflector 130 structured such that a third layer 133 is provided at one end of a stacked body 134. FIG. 5B shows a calculation result showing that, similar to the above-described example, the reflectance can be suppressed by arranging the third layer 133. In the calculation, it is assumed that the first layers 131, which are high-refractive-index layers, are formed of $Al_{0.2}Ga_{0.8}As$, the second layers 132, which are low-refractive-index layers, are formed of $Al_{0.8}Ga_{0.2}As$, and the third layer is formed of $Al_{0.45}Ga_{0.55}As$. The refractive indices of the first to third layers are $n_1=3.35$, $n_2=3.05$, and $n_3=3.2$.

In FIG. 5B, the dashed line shows the wavelength dependency of the reflectance of a reflector in which 22 pairs of layers, each pair including a first layer and a second layer, and an additional first layer (22.5 pairs) are stacked together such that the first and second layers are alternately arranged and the outermost layers are the first layers 131. Also, the dotted chain line shows the wavelength dependency of the reflectance of a reflector in which 40 pairs of layers, each pair including a first layer and a second layer, and an additional first layer (40.5 pairs) are stacked together such that the first and second layers are alternately arranged and the outermost layers are the first layers. The solid line shows the wavelength dependency of the reflectance of a reflector in which the third layer is provided on one of the first layers at both ends of the above-mentioned reflector including the 40.5 pairs of layers (40.5 pairs+third layers). The optical thickness of each of the first to third layers is set to ¼ of the center wavelength (1060 nm).

It is clear from FIG. 5B that effects similar to that in FIG. 4, which shows the case in which the third layers are provided on both ends of the stacked body, can be obtained. More specifically, the peak reflectance of the reflector including the 22.5 pairs of layers is about 99.5%, and that of the reflector including the 40.5 pairs of layers is about 99.9%. Although the peak reflectance of the reflector including the 22.5 pairs of layers is suitable for light emission, the reflection range is narrow. In contrast, when the reflector including the 40.5 pairs of layers is used, although the reflection range is wide, since the peak reflectance is about 99.9%, the light emission efficiency is not very high. With the reflector according to the present embodiment (40.5 pairs+third layer), the reflection range is wide and the reflectance is within an appropriate range. When the reflector having such a structure is used as the reflector at the light emission side, the laser beam can be efficiently oscillated over a wide wavelength range in the surface emitting laser. The structure in which the third layer is provided at only one end of the reflector as illustrated in FIG. 5A is suitable for the lower reflector. In the case where the lower reflector has this structure, the third layer 133 is in contact with the stacked body 134 and with one of (i) the lower cladding layer 103, (ii) the substrate 102, and (iii) an air layer 109 when a hole is formed through the substrate 102 and the electrode 101. Here, the third layer 133 has a refractive index higher than those of the lower cladding layer 103, the substrate 102, and the air layer 109.

In the case of (iii), an interface between the third layer and air, which have a large difference in refractive index, can be formed by forming a hole that extends through the substrate to the lower reflector by etching or the like after forming the semiconductor layers on the substrate by epitaxial growth.

It can be said that the surface emitting laser according to the present embodiment has a structure in which first layers and second layers are alternately stacked to form a stacked body, the second layers having a refractive index lower than that of the first layers, and a reflection suppressing layer is provided on the stacked body.

Upper Reflector and Lower Reflector

In the present embodiment, at least one of the upper and lower reflectors includes a stacked body having the above-described multilayer structure, and the upper and lower reflectors may each include a stacked body having the above-described multilayer structure. The structures and materials of the upper and lower reflectors according to the present embodiment may be selected individually.

One of the upper and lower reflectors may be a diffraction grating, for example, a high contrast grating (HCG) mirror. HCG mirrors are configured such that high-refractive-index materials and low-refractive-index materials are alternately and periodically arranged in an in-plane direction. An example of an HCG mirror includes a periodic structure formed by processing a semiconductor layer, such as an AlGaAs layer, so that periodic gap portions are formed therein. In the periodic structure, high-refractive-index regions (AlGaAs portions) and low-refractive-index regions (gap portions) are periodically arranged.

In wavelength tunable VCSELs, a mirror that is light may be used as the movable reflector (upper reflector in FIG. 1) to ensure a high wavelength tuning speed. Therefore, in the present embodiment, a thin, light HCG mirror may be used as the upper reflector instead of a thick, heavy multilayer mirror.

The stacked body of multiple layers included in at least one of the upper and lower reflectors is not limited to a semiconductor multilayer mirror, and may instead be a dielectric multilayer mirror. A dielectric multilayer film including a plurality of pairs of layers, each pair including a $SiO_2$ layer as a silicone oxide layer and a $TiO_2$ layer as a titanium oxide layer, is an example of a dielectric multilayer mirror.

In the case where a semiconductor multilayer mirror is used, that is, in the case where the first, second, and third layers are all semiconductor layers, the materials of the semiconductor layers may be those expressed as $Al_xGa_{(1-x)}As$ ($0 \leq x \leq 1$). For example, a semiconductor multilayer film including a plurality of pairs of layers, each pair including a GaAs layer as a high-refractive-index layer and an $Al_xGa_{(1-x)}As$ layer ($0.9 \leq x \leq 1$) as a low-refractive-index layer, may be used. As the high-refractive-index layers, AlAs layers, where x=1, may instead be used.

The reflectance and the width of the reflection range in which the reflectance is high can be controlled by appropriately changing the number of pairs of layers included in the multilayer mirror.

In the embodiment of the present invention, the movable mirror may have a micro electro mechanical system (MEMS) structure, such as the structure of a silicone cantilever driven by electrostatic attraction.

In the surface emitting laser according to the above-described embodiment, the upper reflector 130 is used as the reflector at the light emission side. However, the lower reflector 110 may instead be used as the reflector at the light emission side. The peak reflectance of the reflector at the light emission side is lower than that of the reflector at the other side.

The reflectance of the reflector at the light emission side may be in the range of 99.0% to 99.5%. In the design of a DBR, in general, the reflectance increases as the number of pairs of layers, each pair including a first layer 131 as a high-refractive-index layer and a second layer 132 as a low-refractive-index layer, increases. Therefore, when the materials of the high-refractive-index layers and low-refractive-index layers are determined, the number of pairs of layers is roughly determined. In the present embodiment, the number of pairs of layers included in the upper reflector 130 is set so as to be greater than the number of pairs of layers included in a typical DBR designed as a reflector at the light emission side. More specifically, to a DBR including a sufficient number of pairs of layers to achieve a peak reflectance of 99.5% or more, several tens of pairs of layers formed of the same materials as those of the layers included in the DBR is added. The number of pairs of layers included in the reflector at the light emission side may be such that, when the third layer is provided, the reflectance is in the range of 99.0% to 99.5%, which is an example of an appropriate reflectance range.

In the above-described embodiment of the present invention, the third layer 133 is in contact with the air layer 108. However, a dielectric material, such as $SiO_2$, having a refractive index lower than that of the third layers 133 may instead be used. Also when $SiO_2$ is used, there is a large difference in refractive index between $SiO_2$ and the third layer. In addition, when a dielectric material is used, the environment resistance can be increased compared to the case in which the semiconductor layer (third layer) is in direct contact with the air.

In general, in a DBR formed of dielectrics, the difference in refractive index can be more easily increased than in a DBR formed of semiconductors, and therefore a high reflectance can be obtained with a small number of layers. However, although the number of pairs of layers in the DBR formed of semiconductors is greater than that in the DBR formed of dielectrics, the DBR formed of semiconductors is beneficial with regard to processes in that deposition can be performed during crystal growth and a current can be applied by doping. In the case where the DBR is formed of semiconductors, with which it is more difficult to increase the difference in refractive index than with dielectrics, the reflectance and reflection range can be increased by increasing the number of layers. For example, 35 or more of pairs of layers, each pair including a first layer as a high-refractive-index layer and a second layer as a low-refractive-index layer, may be stacked together such that the first and second layers are alternately arranged.

Active Layer

The active layer according to the present embodiment is not particularly limited as long as the active layer emits light when a current is applied thereto. In the case where light with a wavelength range around 850 nm is to be emitted, a material having a quantum well structure made of $Al_nGa_{(1-n)}As$ ($0 \leq n \leq 1$) may be used. In the case where light with a wavelength range around 1060 nm is to be emitted, a material made of $In_nGa_{(1-n)}As$ ($0 \leq n \leq 1$) may be used.

According to the present embodiment, the active layer may have a gain over a sufficiently wide range, more specifically, over a wavelength range wider than the reflection ranges of the upper and lower reflectors. Such an active layer may be, for example, one having a quantum well structure with which light can be emitted at least at two different energy levels. The quantum well structure may include a single quantum well or a multiple quantum well formed of a plurality of layers.

The material and structure of the active layer according to the present embodiment may be selected as appropriate in accordance with the intended oscillation wavelength.

The active layer according to the present embodiment may be configured to emit light either when the active layer is excited by being irradiated with light or when a current is applied to the active layer. The surface emitting laser according to the present embodiment or an optical coherence tomography apparatus, which will be described below, may include an excitation light source for exciting the active layer or a power supply for applying a current to the active layer.

First Cladding Layer and Second Cladding Layer

In the embodiment of the present embodiment, cladding layers are provided to trap the light and carriers. In addition, in the embodiment of the present invention, the cladding layers serve a function as spacers for adjusting the cavity length.

In the present embodiment, AlGaAs layers in which the Al composition is appropriately selected in accordance with the wavelength range of the emitted light may be used as the first and second cladding layers. For example, in the case where light with a wavelength range around 850 nm is to be emitted, $Al_{0.8}GaAs$ layers may be used. In the case where light with a wavelength range around 1060 nm is to be emitted, stacks of $Al_{0.4}GaAs$ and GaAs layers may be used. The first and second cladding layers may be of different conductivity types. With regard to the cavity length, in a wavelength-fixed VCSEL, the resonator may be a $\lambda$ resonator or a long-cavity resonator having a cavity length of about $5\lambda$, and the thicknesses of the cladding layers are adjusted to ensure sufficient cavity length. In a wavelength tunable VCSEL, in consideration of the movable range (gap portion described below) and driving of the movable mirror and the current blocking structure, the thicknesses of the cladding layers are adjusted so that an appropriate cavity length can be obtained. For example, the resonator may be a $3\lambda$ or $4\lambda$ resonator. The thicknesses of the first and second cladding layers are not necessarily adjusted to be equal to each other, and may be selected as appropriate as long as the cavity length can be adjusted.

Current Blocking Layer

In the present embodiment, a current blocking layer that limits the region in which a current applied to the laser flows can be provided as necessary. The current blocking layer may be formed by, for example, implanting hydrogen ions or selectively oxidizing an AlGaAs layer provided in a cladding layer and having an Al composition of 90% or more. In the present embodiment, the current blocking layer is not necessary in the case where light is emitted when the active layer is excited by being irradiated with light. The current blocking layer is suitable for use in the case where light is emitted when a current is applied to the active layer.

Gap Portion

In the present embodiment, no solid material is generally provided in the gap portion. The gap portion may be vacuum or filled with fluid, for example, air, inert gas, or liquid such as water, depending on the atmosphere of the gap portion. The length of the gap portion ($\alpha$ in FIG. 1) may be determined in consideration of the tunable wavelength range and pull-in of the movable mirror. For example, in the case where the gap portion is filled with air and the tunable wavelength range is 100 nm with 1060 nm at the center, the length of the gap portion is about 2 μm.

Driving Unit

The driving unit is not particularly limited as long as the cavity length of the wavelength tunable VCSEL according to the present embodiment can be varied. The driving unit may be configured to operate, for example, by using a MEMS mechanism in response to a voltage applied thereto or by using a piezoelectric material. Although the driving unit has a cantilever structure in the present embodiment, the driving unit may instead have a doubly supported beam structure.

The driving unit according to the present embodiment may move the upper reflector, the lower reflector, or both the upper and lower reflectors.

Optical Coherence Tomography Apparatus

Figure 6:
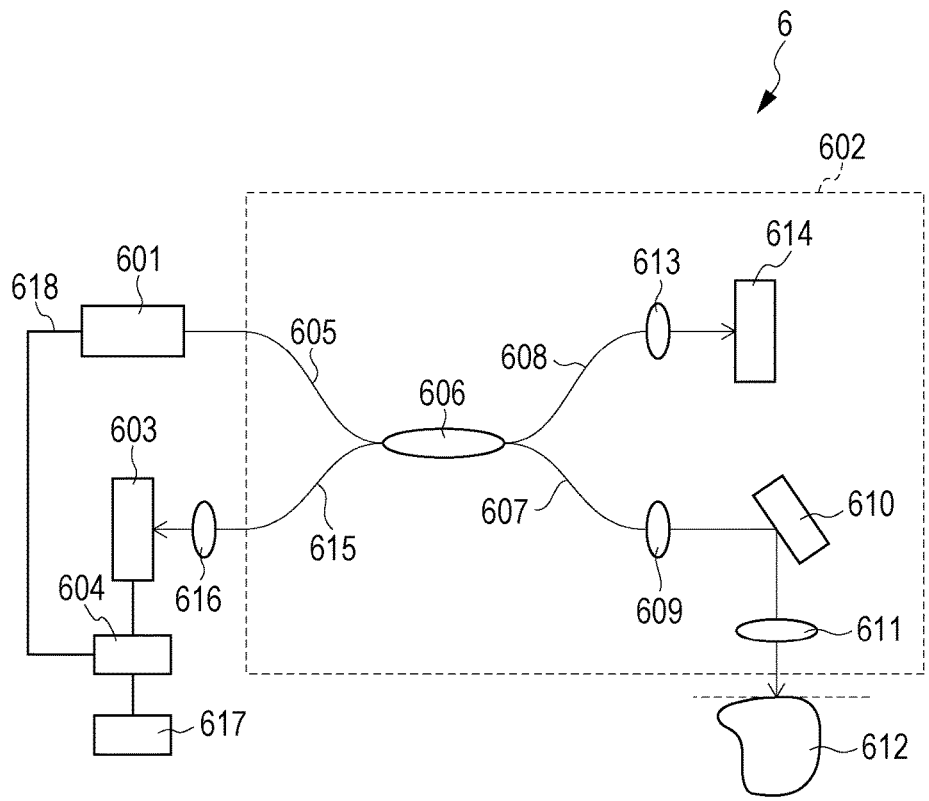
FIG. 6 illustrates the structure of an optical coherence tomography apparatus according to the embodiment of the present invention.

An optical coherence tomography (OCT) apparatus including a wavelength tunable light source does not include a spectroscope, and is therefore expected to be capable of acquiring tomographic images with high SN ratio and low loss in the amount of light. An example in which the surface emitting laser according to the present embodiment is used as a light source unit of an OCT apparatus will now be described with reference to FIG. 6.

An OCT apparatus 6 according to the present embodiment includes at least a light source unit 601, an interference optical system 602, a light detecting unit 603, and an information acquisition unit 604. The light source unit 601 may be the above-described surface emitting laser. Although not illustrated, the information acquisition unit 604 includes a Fourier transformer. The form of the Fourier transformer included in the information acquisition unit 604 is not particularly limited as long as the information acquisition unit 604 has a function of taking the Fourier transform of data input thereto. For example, the information acquisition unit 604 may include a computing unit, and the computing unit may have a function of taking the Fourier transform. More specifically, the computing unit is a computer including a central processing unit (CPU), and the computer executes an application having a Fourier transform function. As another example, the information acquisition unit 604 may include a Fourier transform circuit having a Fourier transform function. Light emitted from the light source unit 601 passes through the interference optical system 602, and is output as interference light having information of a measurement object 612. The interference light is received by the light detecting unit 603. The light detecting unit 603 may either be a difference detecting type or simple intensity monitor type. Information regarding the temporal waveform of the intensity of the received interference light is transmitted from the light detecting unit 603 to the information acquisition unit 604. The information acquisition unit 604 acquires the peak value of the temporal waveform of the intensity of the received interference light and takes the Fourier transform to acquire information of the object 612 (for example, information of a tomographic image). Components other than the light source unit 601, the interference optical system 602, the light detecting unit 603, and the information acquisition unit 604 described herein may also be provided optionally.

Next, the operation from the oscillation of light in the light source unit 601 to acquisition of information of the tomographic image of the measurement object will be described in detail.

Light which has been emitted from the wavelength tunable light source unit 601 passes through an optical fiber 605, enters a coupler 606, where the light is divided into irradiation light which passes through an irradiation light fiber 607, and reference light which passes through a reference light fiber 608. The coupler 606 may be configured to operate in a single mode in the wavelength range of the light source, and 3 dB couplers may be uses as fiber couplers. The irradiation light passes through a collimator 609 so that the irradiation light is collimated, and is reflected by a mirror 610. The light reflected by the mirror 610 passes through a lens 611, is incident on the object 612, and is reflected by each layer of the object 612 in the depth direction of the object 612. The reference light passes through a collimator 613 and is reflected by a mirror 614. The coupler 606 generates the interference light by causing the reflected light from the object 612 and the reflected light from the mirror 614 to interfere with each other. The interference light passes through an optical fiber 615, is collected through a collimator 616, and received by the light detecting unit 603. Information regarding the intensity of the interference light received by the light detecting unit 603 is converted into electrical information such as voltage, and is transmitted to the information acquisition unit 604. The information acquisition unit 604 processes the data of the intensity of the interference light, more specifically, takes the Fourier transform of the data to acquire information of the tomographic image. The data of the intensity of the interference light subjected to the Fourier transform is normally data sampled at equal wavenumber intervals. However, data sampled at equal wavelength intervals may instead be used.

The acquired information of the tomographic image may be transmitted from the information acquisition unit 604 to an image display unit 617 and displayed as an image. A three-dimensional tomographic image of the measurement object 612 can be obtained by scanning the mirror 611 along a plane perpendicular to the direction in which the irradiation light is incident. The information acquisition unit 604 may control the light source unit 601 through an electric circuit 618. Although not illustrated in FIG. 6, the intensity of the light emitted from the light source unit 601 may be monitored, and the monitored data may be used to correct the amplitude of the signal representing the intensity of the interference light. The surface emitting laser according to the embodiment of the present invention is capable of performing laser beam oscillation over a wide wavelength range while suppressing an increase in threshold current for emitting the laser beam and a reduction in light emitting efficiency. Therefore, when the surface emitting laser according to the present embodiment is included in an OCT apparatus, the current for outputting the laser beam can be reduced, and tomographic images with a high axial resolution can be obtained.

The OCT apparatus according to the embodiment is useful in obtaining a tomographic image of a living body, such as an animal or a human, in the field of ophthalmology, dentistry, dermatology, or the like. Information regarding a tomographic image of a living body includes not only a tomographic image of a living body but also numerical data required to obtain a tomographic image.

In particular, the OCT apparatus may be used to acquire information of a tomographic image of an eye-ground of a human by setting the eye-ground as a measurement object.

Other Usages

The surface emitting laser according to the embodiment of the present invention may be used not only as a light source for an OCT apparatus but also as a light source for optical communication or optical measurement.

EXAMPLES

Examples of the present invention will now be described. The structures of active layers and other structures described below are merely examples, and do not limit the scope of the invention. In addition, although specific manufacturing methods of surface emitting lasers are described in the following examples, the dimensions of components of the lasers, manufacturing steps, devices, and various parameters are not limited to those in the examples described below. In addition, semiconductor materials, electrode materials, dielectric materials, etc., are also not limited to those described in the examples.

First Example

The structure of a wavelength tunable VCSEL having a center wavelength of 1060 nm according to a first example will be described with reference to FIG. 1. As illustrated in FIG. 1, the wavelength tunable VCSEL according to the present example has a cantilever structure.

The surface emitting laser according to the present example includes an n-type GaAs substrate as a substrate 102, an n-type semiconductor DBR as a lower reflector 110, an InGaAs layer having a quantum well structure as an active layer 104, a GaAs layer as a support layer 106, and an n-type semiconductor DBR as an upper reflector 130.

The lower reflector 110 is structured such that 40 pairs of layers, each pair including a GaAs layer and an AlAs layer, are stacked together such that the GaAs and AlAs layers are alternately arranged.

An $Al_{0.98}Ga_{0.02}As$ layer is used as a current blocking layer 121, and a current blocking structure is formed by selective oxidation. Electrodes for driving the laser include an n-type electrode formed of AuGe/Ni/Au as a lower electrode 101 and a p-type electrode formed of Ti/Au as an upper electrode 105. These electrodes apply a current to the active layer 104 so that light is emitted and laser oscillation occurs. Then, when a MEMS driving process is performed by using a driving unit 140 to move the upper reflector 130 in a y direction, the wavelength of the laser beam can be changed.

The structure of the upper reflector 130 will now be described with reference to FIG. 2.

The upper reflector 130 according to the present example includes a stacked body 134 in which 47 pairs of layers, each pair including a first layer 131 and a second layer 132, are stacked such that the first and second layers 131 and 132 are alternately arranged, and in which an additional first layer 131 is stacked on the outermost second layer 132. Third layers 133 are formed on the surfaces at both ends of the stacked body 134. The first layers 131 are $Al_{0.2}Ga_{0.8}As$ layers, which have a high refractive index, the second layers 132 are $Al_{0.8}Ga_{0.2}As$ layers, which have a low refractive index, and the third layers 133 are $Al_{0.55}Ga_{0.45}As$ layers. The refractive indices of the first layers 131, the second layers 132, and the third layers 133 are 3.35, 3.05, and 3.15, respectively. The optical thickness of the first layers 131, the second layers 132, and the third layers 133 is ¼ of the above-described center wavelength.

In the graph of FIG. 4, the solid line shows the calculation result of the wavelength dependency of the reflectance of the upper reflector having the above-described structure. With the reflector according to the present example (47.5 pairs+ third layers), the reflection range is wide and the reflectance is in an appropriate range. When this reflector is disposed at the light emission side of a surface emitting laser, a laser beam can be efficiently oscillated over a wide range.

The wavelength tunable VCSEL according to the present example can be manufactured by epitaxial growth and selective wet etching. The gap portion 107 can be formed by forming a GaAs layer as a sacrificial layer and performing selective wet etching. When a mixed solution of water, critic acid, and hydrogen peroxide is used as an etchant for GaAs, selective etching can be performed in accordance with the Al composition of AlGaAs. In the present example, a mixture of citric acid solution, obtained by mixing water and critic acid (weight ratio 1:1), and a hydrogen peroxide solution with a concentration of 30% at a ratio of 4:1 was used as the etchant. The etching time is controlled so as to leave the GaAs layer 106 that supports the beam of the upper reflector 130 and the upper reflector 130. Thus, the wavelength tunable VCSEL according to the present example is formed.

Second Example

A wavelength tunable VCSEL according to a second example of the present invention will now be described with reference to FIG. 7. In the second example, only the difference between the first and second examples will be described, and descriptions of common points will be omitted. In the present example, an n-type semiconductor DBR described below is used as a lower reflector 710.

The lower reflector 710 according to the present example includes a stacked body 734 in which 40 pairs of layers, each pair including a first layer 731 and a second layer 732, are stacked such that the first and second layers 731 and 732 are alternately arranged, and in which an additional first layer 731 is stacked on the outermost second layer 732. A third layer 733 is provided on a surface of the stacked body 734 at one end of the stacked body 734. The third layer 733 is in contact with the stacked body 734 and an air layer 709.

The first layers 731 are $Al_{0.2}Ga_{0.8}As$ layers, which have a high refractive index, the second layers 732 are $Al_{0.8}Ga_{0.2}As$ layers, which have a low refractive index, and the third layers 733 are $Al_{0.45}Ga_{0.55}As$ layers. The refractive indices of the first layers 731, the second layers 732, and the third layers 733 are 3.35, 3.05, and 3.2, respectively. The optical thickness of the first layers 731, the second layers 732, and the third layers 733 is ¼ of the above-described center wavelength.

In the present example, an HCG mirror is used as an upper reflector 730. A wavelength tunable VCSEL according to the present example is structured such that light is emitted through the lower reflector 710, and a hole is formed so as to extend through a substrate 702 and a lower electrode 701 so that a laser beam is allowed to pass therethrough.

Figure 7:
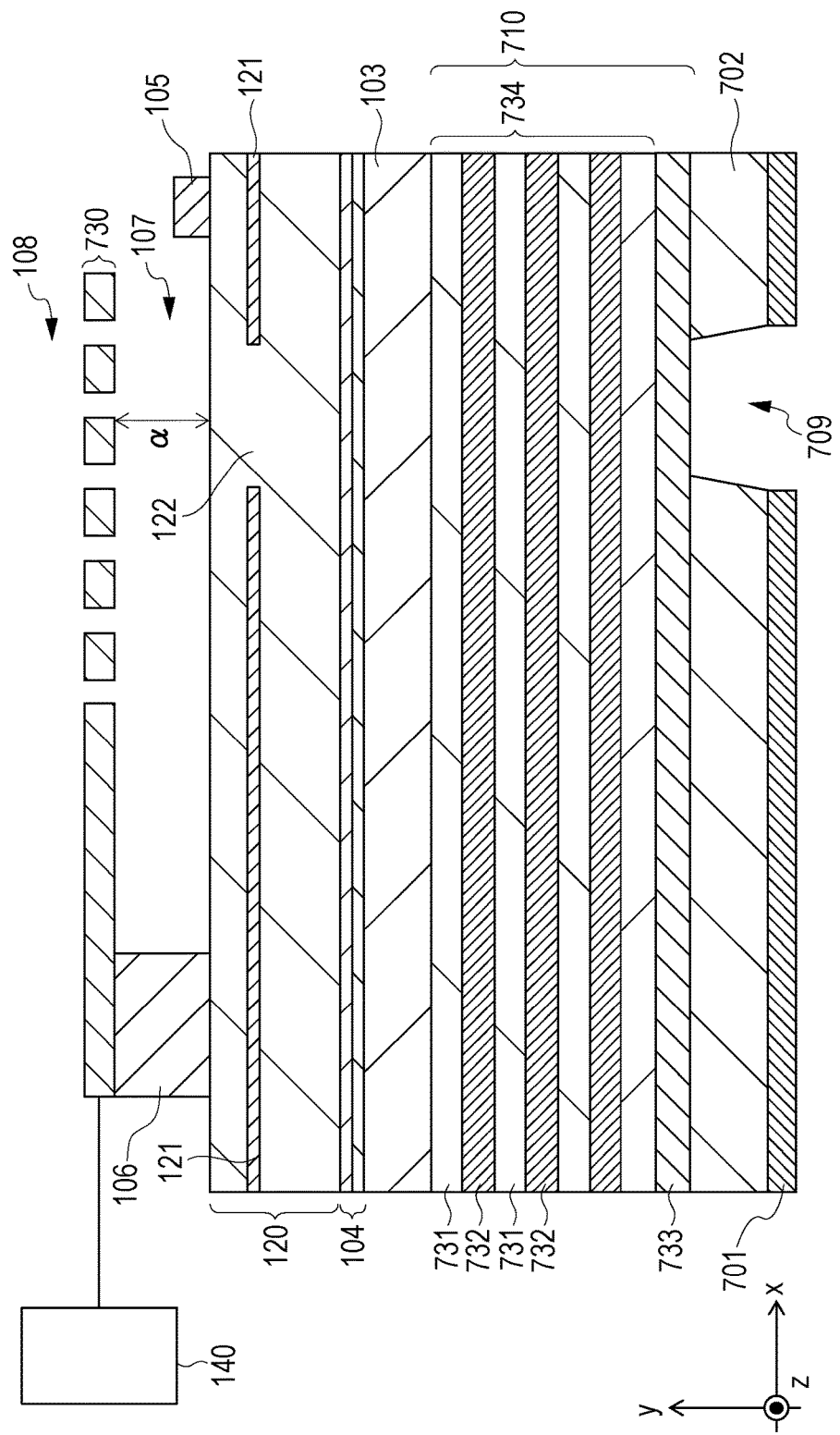
FIG. 7 is a sectional view illustrating the structure of a wavelength tunable VCSEL according to a second example of the present invention.

Referring to FIG. 7, the HCG mirror that serves as the upper reflector 730 constitutes a grid in which air regions (regions between rectangular white portions that are adjacent to each other) and $Al_{0.7}Ga_{0.3}As$ portions (rectangular white portions) are alternately arranged. To form such an HCG mirror, a sacrificial layer made of GaAs is formed under an $Al_{0.7}Ga_{0.3}As$ layer, and a pattern is formed by electron beam (EB) drawing. Then, the $Al_{0.7}Ga_{0.3}As$ layer is etched by dry etching. Then, the sacrificial layer made of GaAs is removed, so that the periodic structure in which the $Al_{0.7}Ga_{0.3}As$ portions and air portions are arranged along a plane, as illustrated in FIG. 7, is formed.

Similar to the first example, in the wavelength tunable VCSEL according to the present example, the wavelength of the emitted light varies when the upper reflector 730 is moved in the y direction. When an HCG mirror is used as in the present example, compared to the case in which a semiconductor DBR is used as a driving unit, the thickness of the member to be moved can be reduced. Therefore, high-speed driving, that is, high-speed wavelength variation, can be achieved.

Third Example

Figure 8:
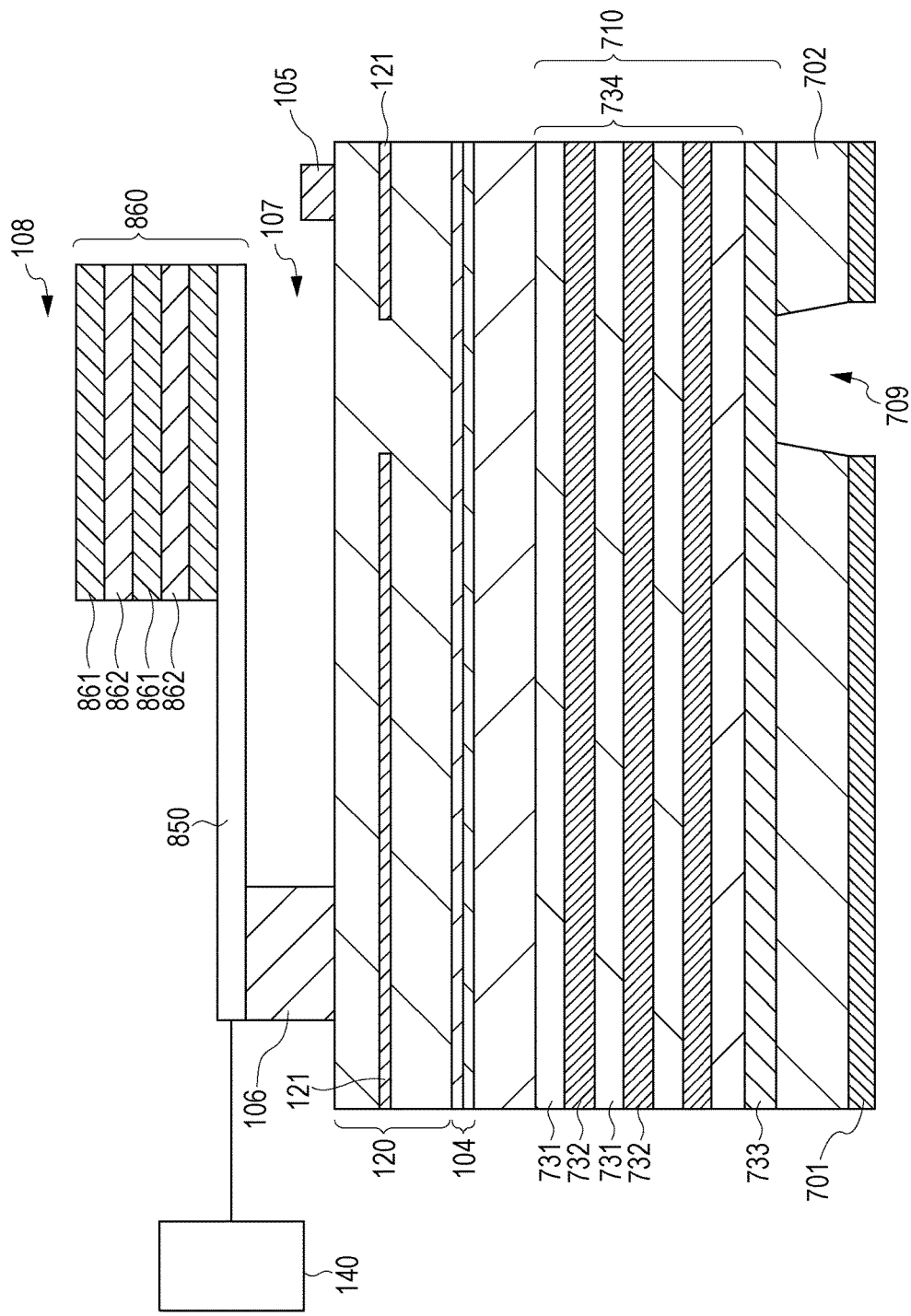
FIG. 8 is a sectional view illustrating the structure of a wavelength tunable VCSEL according to a third example of the present invention.
Figure 9A:
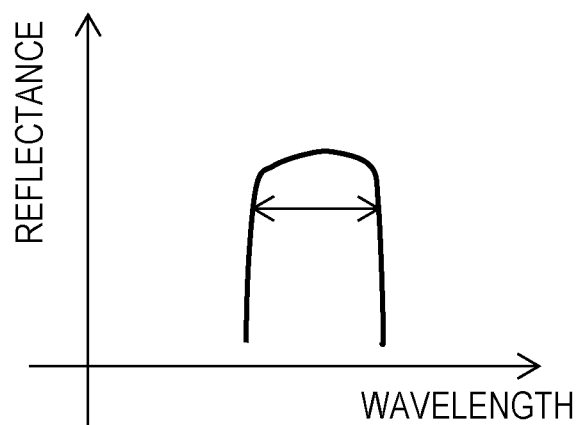
FIGS. 9A and 9B are diagrams for describing a situation to be solved by an embodiment of the present invention.
Figure 9B:
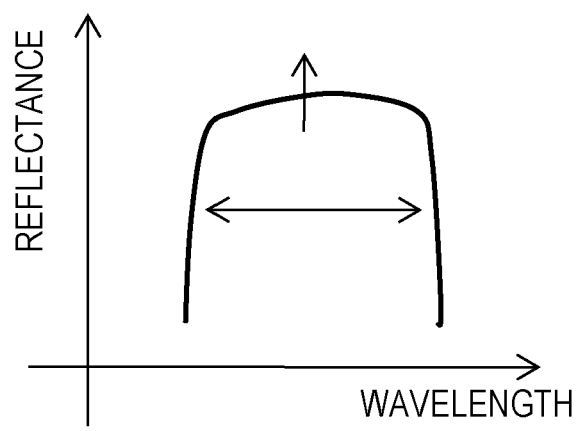

A wavelength tunable VCSEL according to a third example of the present invention will now be described with reference to FIG. 8. In the third example, only the difference between the second and third examples will be described, and descriptions of common points will be omitted.

In the present example, a dielectric DBR is used as an upper reflector 860. The dielectric DBR is provided on a semiconductor layer 850 made of $Al_{0.7}Ga_{0.3}As$. The dielectric DBR is structured such that 5 pairs of layers, each pair including a high-refractive-index layer 861 and a low-refractive-index layer 862, are stacked such that the high-refractive-index layers 861 and the low-refractive-index layers 862 are alternately arranged and such that an additional high-refractive-index layer 861 is stacked on the outermost low-refractive-index layer 862. The high-refractive-index layers 861 are $TiO_2$ layers, and the low-refractive-index layers 862 are $SiO_2$ layers.

When a dielectric DBR is used as an upper reflector as in the present example, compared to the case in which a semiconductor DBR is used, a high reflectance can be obtained over a wide reflection range even when the number of pairs of layers, each layer including a high-refractive-index layer and a low-refractive-index layer, is small. Since the number of layers can be reduced compared to the case in which a semiconductor DBR is used, this upper reflector is suitable for use as a mirror that is driven. The dielectric DBR may be formed after the semiconductor layers other than the dielectric DBR are formed together.

According to an embodiment of the present invention, a surface emitting laser with which the light emission efficiency is not reduced and the threshold current is not increased over a wide wavelength range can be provided by arranging a reflection suppressing layer on a reflector included in the surface emitting laser.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-244997 filed Nov. 27, 2013, which is hereby incorporated by reference herein in its entirety.

What is claimed is:
1. A surface emitting laser comprising:
a lower reflector;
an active layer;
a gap portion;
an upper reflector; and
a driving unit is configured to change a cavity length between the lower reflector and the upper reflector,
wherein the lower reflector, the active layer, the gap portion, and the upper reflector are arranged in that order,
wherein the surface emitting laser is capable of varying a wavelength of emitted light by changing a distance between the upper and lower reflectors,
wherein the driving unit is configured to move the upper reflector in an optical axis direction of the emitted light for changing the cavity length, wherein the upper reflector includes
- a stacked body in which first layers and second layers are alternately stacked, the second layers having a refractive index lower than a refractive index of the first layers, outermost layers of the stacked body being the first layers, and
- a third layer provided on both ends of the stacked body and configured such that an optical thickness nd of the third layer satisfies $0<nd<\lambda_0/2$, where $\lambda_0$ is a center wavelength of the emitted light, the third layer having a refractive index that is lower than the refractive index of the first layers and higher than a refractive index of a layer provided adjacent to the third layer at a side opposite to a side at which the stacked body is provided, and wherein the first layers, the second layers, and the third layer are all semiconductor layers.

2. The surface emitting laser according to claim 1, wherein the layer provided adjacent to the third layer is air.

3. The surface emitting laser according to claim 1, wherein the optical thickness nd satisfies $\lambda_0/8<nd<3\lambda_0/8$.

4. The surface emitting laser according to claim 1, wherein the optical thickness nd is $\lambda_0/4$.

5. The surface emitting laser according to claim 1, wherein a reflectance of the stacked body with respect to the center wavelength $\lambda_0$ is 99.5% or more.

6. The surface emitting laser according to claim 1, wherein the stacked body includes 35 or more pairs of layers, each pair including one of the first layers and one of the second layers.

7. The surface emitting laser according to claim 1, wherein each of the semiconductor layers includes a material expressed as $Al_xGa_{(1-x)}As$ ($0 \leq x \leq 1$).

8. The surface emitting laser according to claim 1, wherein the driving unit moves the upper reflector.

9. The surface emitting laser according to claim 1, wherein the upper reflector is a diffraction grating.

10. The surface emitting laser according to claim 1, wherein the driving unit moves the lower reflector.

11. The surface emitting laser according to claim 1, wherein the lower reflector includes the stacked body.

12. The surface emitting laser according to claim 1, wherein the active layer emits light when the active layer is excited by being irradiated with light.

13. The surface emitting laser according to claim 1, wherein the active layer emits light when a current is applied to the active layer.

14. An optical coherence tomography apparatus comprising:
- a light source unit that varies a wavelength of light;
- an interference optical system that divides the light from the light source into irradiation light with which an object is to be irradiated and reference light and generates interference light by causing reflected light of the irradiation light with which the object has been irradiated and the reference light to interfere with each other;
- a light detecting unit that receives the interference light; and
- an information acquisition unit that acquires information of the object by processing a signal from the light detecting unit, wherein the light source unit is the surface emitting laser according to claim 1.

15. The apparatus according to claim 14, wherein the optical thickness nd satisfies $\lambda_0/8<nd<3\lambda_0/8$.

16. The apparatus according to claim 14, wherein the optical thickness nd is $\lambda_0/4$.

* * * * *